(12) United States Patent
Patapoutian

(10) Patent No.: US 8,040,994 B1
(45) Date of Patent: Oct. 18, 2011

(54) PHASE COEFFICIENT GENERATION FOR PLL

(75) Inventor: Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 1247 days.

(21) Appl. No.: 11/688,063

(22) Filed: Mar. 19, 2007

(51) Int. Cl.
H03D 3/24 (2006.01)

(52) U.S. Cl. ........ 375/376; 375/371; 375/357; 375/373; 327/151; 370/503

(58) Field of Classification Search .................. 375/376, 375/371, 373, 354; 327/141; 370/303
See application file for complete search history.

(56) References Cited

U.S. PATENT DOCUMENTS

| | | | |
|---|---|---|---|
| 4,797,845 A | 1/1989 | Stikvoort | |
| 4,855,689 A * | 8/1989 | Kinkel | 331/17 |
| 5,572,558 A * | 11/1996 | Beherns | 375/376 |
| 5,638,406 A * | 6/1997 | Sogabe | 375/326 |
| 6,236,343 B1 | 5/2001 | Patapoutian | |
| 6,351,164 B1 * | 2/2002 | Yoshie | 327/156 |
| 6,426,845 B1 | 7/2002 | Sacks et al. | |
| 6,898,255 B2 | 5/2005 | Kim | |
| 7,617,269 B2 * | 11/2009 | Dewan | 708/700 |
| 2005/0078398 A1 * | 4/2005 | Hutchins | 360/67 |
| 2009/0232261 A1 * | 9/2009 | Ho et al. | 375/350 |

* cited by examiner

Primary Examiner — Dac Ha
Assistant Examiner — Tanmay Shah
(74) Attorney, Agent, or Firm — Alan G. Rego; Westman, Champlin & Kelly, P.A.

(57) ABSTRACT

A method and apparatus is provided for synchronizing a clock signal by generating time varying PLL phase coefficients which approximate optimal PLL phase coefficients. An acquisition mode phase coefficient is determined by adding an error signal (A) to the sample counter (k) and finding the reciprocal of the result (1/(A+k)). The reciprocal can be calculated in hardware or determined by using a lookup table. A tracking mode phase coefficient is determined based on the error signal for use in the PLL during a track a tracking period. The tracking period begins when the tracking mode coefficient is greater than the acquisition mode coefficient.

20 Claims, 6 Drawing Sheets

PHASE COEFFICIENT GENERATION FOR PLL

FIELD

The embodiments disclosed herein relate generally to generating coefficients for a phase locked loop.

BACKGROUND INFORMATION

Phase-locked loops (PLLs) operate in communication systems, control systems, and storage systems such as disk drives, to synchronize signals such as clock signals with data in data signals. In a disk drive, for example, a read head reads data from a disk as an analog signal and an analog to digital (A/D) converter then converts the analog signal to a digital signal to reproduce the stored data. A PLL is used to synchronize the clock signal that controls the sampling of the analog signal by the A/D converter so the sampling times correspond to the locations of data bits in the analog signal.

An analog signal that is generated by reading data from a high density disk generally exhibits a low signal to noise ratio (SNR). Therefore, precise synchronization between the A/D converter's clock signal and the locations of the data bits in the analog signal is needed in order to accurately extract the data.

FIG. 1 illustrates a general system block diagram of a typical prior art PLL 10 that is commonly used in disk drives. The PLL 10 includes an A/D converter 12 that samples the analog input signal 11 and produces corresponding digital values. The A/D converter 12 is coupled to a phase detector 14 which operates in a known manner to generate a phase error signal 15 that corresponds to the phase difference between the analog input signal 11 and the clock signal 18 for the A/D converter 12. The phase error signal 15 is then filtered by PLL filters 20 and combined to produce a loop error signal 22 that is then used to control a numerically controlled oscillator (NCO) 24. The NCO 24, in turn, controls the frequency and phase of the A/D clock signal 18, that is, adjusts the clock signal, to minimize the loop error signal 22.

The PLL filters 20 utilize coefficients, to weight the respective phase errors 15, and thus control how the PLL 10 responds to errors. The coefficients typically include a phase coefficient (alpha) 26 which affects phase adjustments of the clock signal 18 and a frequency coefficient (beta) 28 which affects frequency adjustments of the clock signal 18.

An illustrative second order PLL filter as known in the prior art is shown in FIG. 2. The phase error signal 15 is filtered by a filter portion 21 to provide a filtered phase error signal 23. The filtered phase error signal is applied to delay circuitry 25 to produce the loop error signal 22.

Optimization of a PLL involves selection of optimal coefficients for the PLL filters. The coefficients can be optimized for fast signal acquisition or for accurate tracking. It is known to employ time-varying coefficients which define an acquisition period and a tracking period of PLL operation. During the acquisition period, acquisition mode phase coefficients are used for a predetermined time or until an error signal falls below a predetermined threshold. The tracking period then begins during which tracking mode coefficients are used in the PLL filters.

It is known that state space methods in general and Kalman filtering techniques in particular can be used to design and analyze synchronizers or PLLs. More specifically, Kalman filtering theory enables us to derive optimal synchronizer structures for a given phase disturbance model, generate time varying and steady state filter coefficients, and calculate the time varying performance of the synchronizer. Usually, the filter coefficients and the performance measure are found recursively using the Kalman recursions.

Optimal or nearly optimal time varying PLL coefficients can be determined using the Kalman filtering methods. To determine PLL coefficients using the Kalman methods, a recursive computing algorithm is required. The recursive algorithm generates PLL coefficients in real time as a function of the sample time k according to Kalman theory. These methods of producing the PLL filter coefficients, however, generally require a large amount of memory and/or complex logic circuitry, and they are expensive for use in certain systems such as computer disk drives.

A known inexpensive method for implementing a PLL in some applications such as disk drive systems requires only a single phase coefficient (alpha) and a single frequency coefficient (beta) in an acquisition mode and another phase coefficient (alpha) and frequency coefficient (beta) in a tracking mode. The acquisition mode coefficients are selected for fast and coarse adjustments of the clock signal. After a predetermined period of time (i.e. a predetermined number, k, of clock pulses) has elapsed, the tracking mode coefficients are substituted for the acquisition mode coefficients. The tracking mode coefficients are typically selected to provide highly accurate phase adjustments.

FIG. 3 is a graph 300 of phase coefficients (alpha) 302 of a PLL versus sample time (k) 304 for an example of this method. A first coefficient 306 is used during an acquisition mode period 308 and another coefficient 210 is used during a tracking mode period 312. The use of one coefficient 306 in an acquisition mode period and another coefficient 310 in the tracking mode period results in sub-optimal filter performance, as compared with the use of the time varying coefficients calculated using Kalman methods. In addition, discontinuity 314 between PLL coefficients at the transition between acquisition mode 308 and tracking mode 312 further degrades performance of the PLL.

Other relatively inexpensive methods of generating PLL coefficients divide the acquisition and tracking periods into multiple regions and use different PLL coefficients for each region. In other words, instead of dividing the operating period of a PLL into only two intervals (acquisition and tracking), three or more intervals are defined. The lengths of and/or the coefficient values associated with each interval are programmable but constant.

FIG. 4 is a graph 400 of phase coefficients (alpha) 402 versus sample time (k) 404, for a PLL wherein the acquisition and tracking periods are divided into multiple regions as described above. While the additional regions and coefficient values better approximate optimal time varying coefficients, there is still a difference between the coefficient profile 406 and the time-varying coefficient profile that is produced by the Kalman predictor. Further, the coefficient profile 406 still includes discontinuities that adversely affect performance.

Accordingly, what is needed is an inexpensive method of producing coefficients that better approximate the coefficients that are predicted by Kalman theory.

SUMMARY

Embodiments disclosed herein generate time varying PLL phase coefficients which approximate optimal PLL phase coefficients. An acquisition mode phase coefficient is determined by adding an error signal (A) to the sample counter (k) and finding the reciprocal of the result (1/(A+k)). The reciprocal can be calculated in hardware or determined by using a lookup table. A tracking mode phase coefficient is determined based on the error signal for use in the PLL during a tracking period. The tracking period begins when the tracking mode coefficient is greater than the acquisition mode coefficient.

An illustrative embodiment determines a constant acquisition parameter (A) based upon at least one synchronization error parameter of a phase locked loop. Samples of the analog input signal are counted to determine a sample count. An acquisition parameter is added to the sampling count to generate a summation. A reciprocal of the summation is provided as a time varying phase coefficient for the phase locked loop.

Another embodiment disclosed herein provides a first programmable register for storing an acquisition parameter of a phase locked loop. A counter is provided in communication with an analog to digital converter of the phase loop. The counter is adapted for providing a sample count of the analog to digital converter. An adder is provided in communication with the register and the counter. The adder provides a sum of the acquisition parameter and sampling clock count. An inverter in communication with the adder receives the sum and provides an inverted sum as an acquisition mode phase coefficient to the phase locked loop.

Another embodiment provides a computer readable medium including executable program instructions for generating a phase coefficient of a PLL. The executable program instructions include instruction for determining a constant acquisition parameter (A) based upon at least one synchronization error parameter of the phase locked loop, counting samples of an analog input signal to determine a sample count, adding the acquisition parameter to the sampling count to generate a summation, and determining a reciprocal of the summation.

BRIEF DESCRIPTION OF THE DRAWINGS

The description below refers to the accompanying drawings, of which.

DETAILED DESCRIPTION OF AN ILLUSTRATIVE EMBODIMENT

The embodiments disclosed herein provide a method and apparatus for generating time varying PLL phase coefficients, which approximate optimal PLL phase coefficients such as those provided by a Kalman filter, by non-recursively manipulating an acquisition parameter throughout the acquisition period and using a constant phase coefficient during tracking. The illustrative embodiments are less complex and less expensive to implement than previously known methods of generating PLL filter coefficients.

The system simplifies the coefficient generation by setting the frequency coefficient (beta) of the PLL to zero for PLLs used in systems in which the estimated frequency error is known to be minimal. A first order PLL can be used wherein beta is constant and the PLL operates in response to the phase coefficient (alpha) only.

A time varying phase coefficient (alpha) is generated in a non-recursive fashion as a function of sample count (k) of the A/D converter. The sample count (k) is reset to zero for every data block read by a disk drive head.

The acquisition mode phase coefficient is generated by adding the acquisition parameter A to the sample count (k) and finding the reciprocal of the result (1/(A+k)). The acquisition parameter A is a ratio of loop error parameters which are measured or calculated in a known manner. The result (1/(A+k)) can be calculated in hardware, or by using a lookup table.

A constant tracking mode phase coefficient S is also determined by performing certain measurements on the system in a known manner. The values of constants A and S are generally determined by a system designer and stored in registers of the PLL filter.

The time varying acquisition mode phase coefficient is compared with the constant tracking mode phase coefficient S. The maximum of the acquisition mode coefficient and tracking mode coefficient is input to the PLL filter as the PLL phase coefficient (alpha). The tracking period begins when the acquisition mode phase coefficient becomes equal to or less than the tracking mode phase coefficient. Therefore, a transition is made between the acquisition period and the tracking period without discontinuity in the PLL coefficients.

The PLL filter coefficients generated according to the inventive method closely approximate the coefficients generated using Kalman methods without using costly recursive algorithms that the Kalman methods require.

Figure 5:
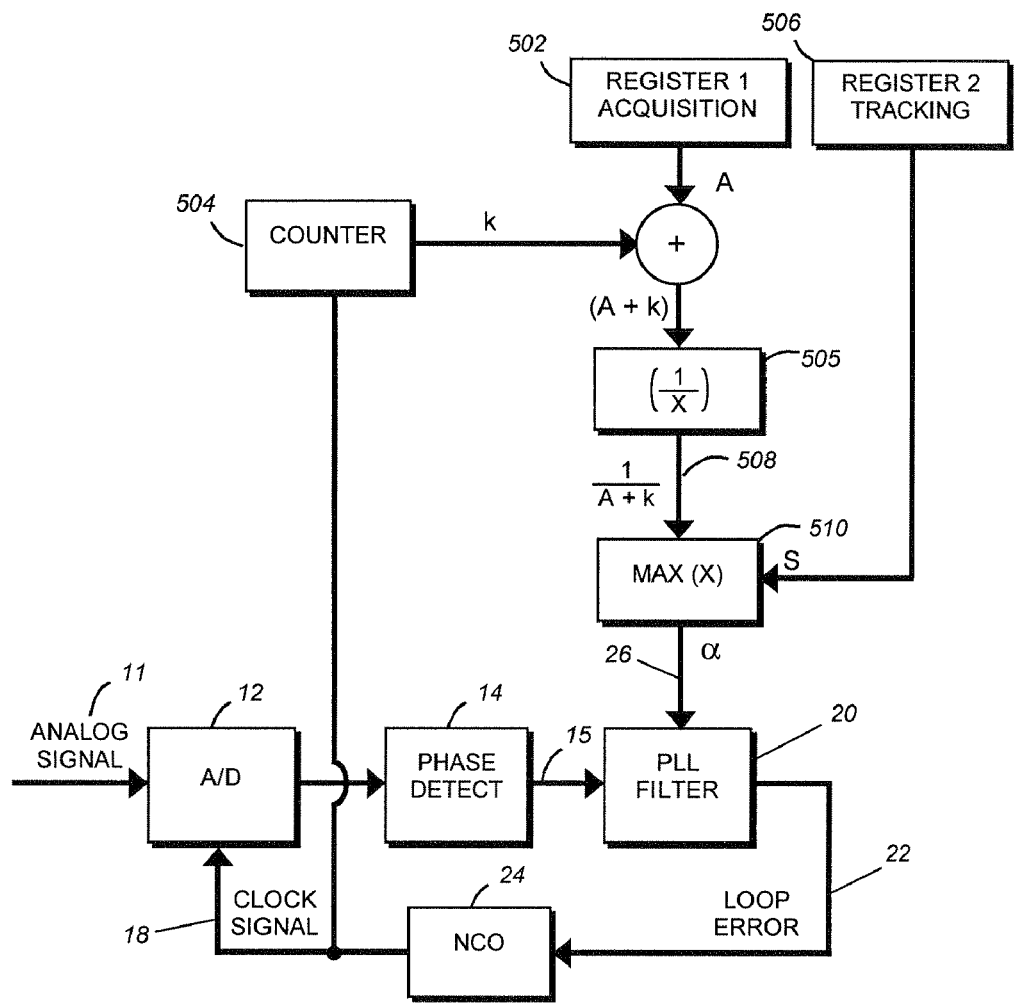
FIG. 5 is a schematic diagram of an illustrative embodiment for generating acquisition mode PLL phase coefficients and tracking mode PLL phase coefficients.

FIG. 5 provides a block diagram of a system that generates a time varying phase coefficient (alpha) for a PLL according to an illustrative embodiment. A first programmable register 502 is used to store an acquisition parameter A. The acquisition parameter A is related to or derived as a function of certain synchronization error parameters calculated and/or measured as known in the art. Such error parameters can include but are not limited to noise variance, variance of initial phase uncertainty and variance of disturbance noise. In an illustrative embodiment, the acquisition parameter A is proportional to the ratio of the noise variance over the variance of initial phase uncertainty. Therefore, the greater the initial phase uncertainty, the smaller the value of A.

A counter 504 provides a sample count k which corresponds to the number of samples of the analog signal 11 taken by the A/D converter 12 since a start time. The counter 504 is reset to zero at the beginning of each acquisition period. A new acquisition period can begin upon reading a new data block, for example, or when a phase error exceeds a predetermined tracking mode error limit. A new phase coefficient (alpha) 26 can be generated for every increment of the counter 504. Preferably, however, the phase coefficient (alpha) 26 is only generated every n increments of the counter 404 because the sampling rate of the A/D converter 12 is much faster than the PLL and coefficient generation circuitry.

At each nth sample, the acquisition parameter (A) is added to the counter output k to generate (A+k) and then the sum is inverted to produce the acquisition mode parameter 1/(A+k). In an illustrative embodiment the inversion of (A+k) could be performed using a simple look-up table. In order to simplify the inversion operation and/or minimize the size of the lookup table, the least significant bits of the term (A+k) may be ignored and coefficient is thus the reciprocal of the remaining most significant bits. The number of bits that may be ignored can be determined according to the acceptable truncation error for a particular application.

A second programmable register 506 is used to store the constant tracking parameter S. In an illustrative embodiment, the tracking parameter S is proportional to the ratio of standard deviation of the disturbance noise over the standard deviation of noise. A comparison block 510 compares the tracking parameter S with the calculated value 1/(A+k) and selects the maximum of these values for use as the phase coefficient (alpha) 26. The phase coefficient (alpha) 26 is provided to the PLL filter 20.

Figure 6:
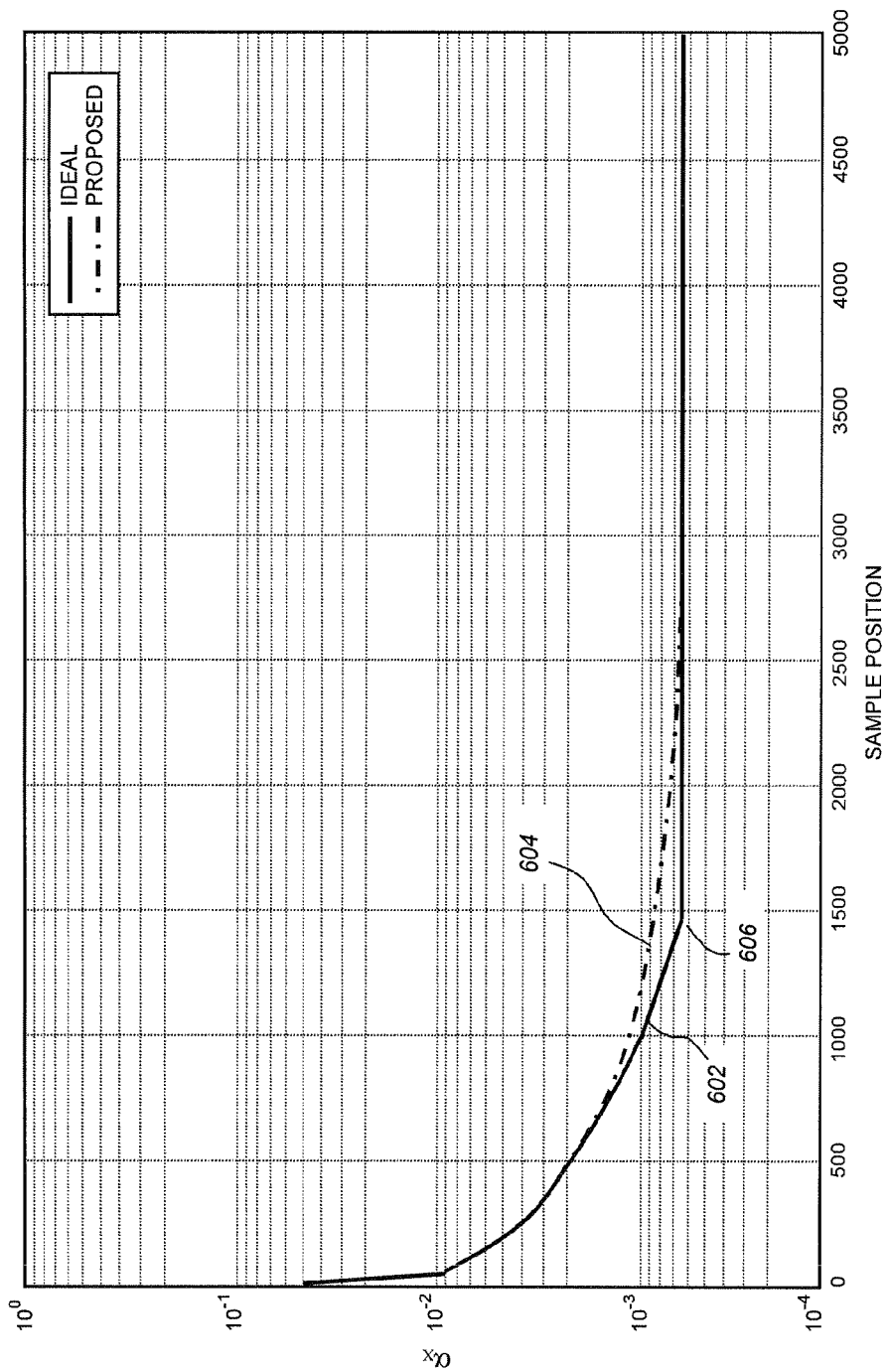
FIG. 6 is a graph of PLL phase coefficients generated according to the illustrative embodiments in comparison to optimal PLL phase coefficients.

The system and method described above with reference to FIG. 5 allows the phase coefficient (alpha) 26 to decrease smoothly with time k during an acquisition period, until the coefficient equals the constant tracking mode phase coefficient S. When the acquisition mode phase coefficient 1/(A+k) becomes less than the tracking mode phase coefficient S, the PLL begins a tracking period by using S as the phase coefficient (alpha) 26. FIG. 6 shows that the methods and apparatus disclosed herein provide a relatively smooth transition 606 between the acquisition period and tracking period. Accordingly, the noisy step transition between tracking mode and acquisition mode of prior art methods is eliminated.

In an alternative embodiment, if a threshold value of k can be predetermined to define the boundary between the acquisition period and the tracking period, an alternative lookup table can be referenced. The alternative lookup table may output the value 1/(A+k) for $k \leq k_{threshold}$ and may output the tracking parameter S for $k > k_{threshold}$, for example. This alternative embodiment could reduce the range of k and limit the size of a lookup table, if a lookup table is used and eliminate the need for the comparison step that is performed by comparison block 510 as described above.

A graphical representation of the time varying phase coefficients (alpha) provided by illustrative embodiments is shown with reference to FIG. 6. The solid curve 602 of FIG. 6 represents the generated phase coefficients (alpha) 26. The dashed curve 604 of FIG. 6, which is shown for comparison, represents the ideal alpha coefficients, such as those provided by a Kalman filter. The ideal alpha coefficients provided by Kalman filter methods can only be generated using recursive methods that are prohibitively expensive or inefficient in most applications.

Figure 7:
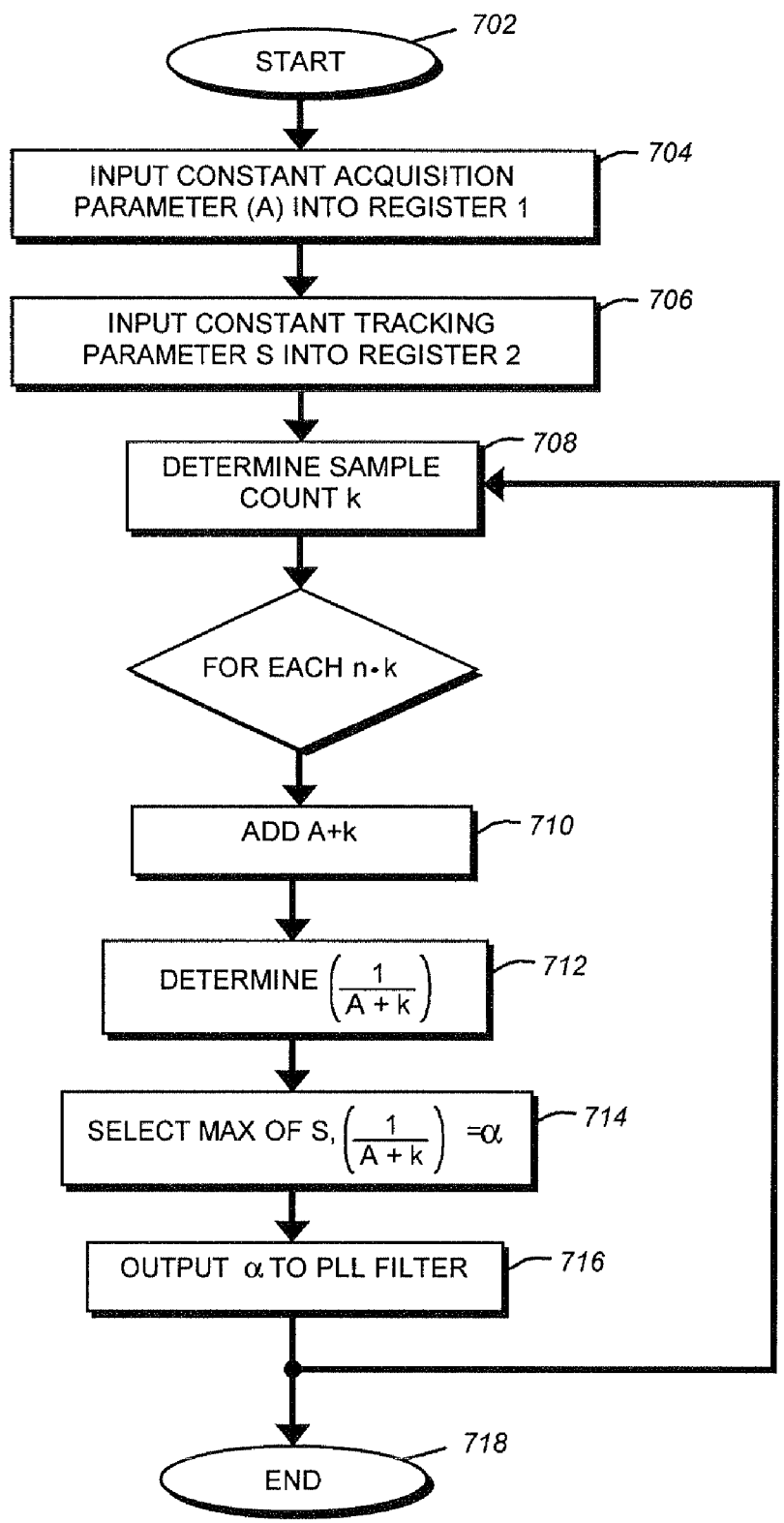
FIG. 7 is a process flow diagram of a method for determining phase coefficients for a PLL according to an illustrative embodiment.

FIG. 7 is a process flow diagram showing the steps of a method for generating a PLL phase coefficient (alpha). The method starts at step 702 and continues to a first setup step 704. In step 704, an acquisition parameter A is stored in a first programmable register. In a second setup step 706, the tracking parameter S is stored in a second programmable register. The acquisition parameter A and tracking parameter S are determined or calculated, as ratios of noise and error parameters, are measured or calculated in a known manner.

In step 708, a counter determines the sample count k of the A/D converter. The sample count k can be reset to begin a new acquisition period at the beginning of each data block read from disk, for example. Alternatively, the sample count k can be reset to begin a new acquisition period if the phase error exceeds predetermined tracking limits. Alternatively, the sample count k can be reset to begin a new acquisition period an arbitrary position in error recovery mode, for example to restart k at a position following a known defect.

In step 710 the acquisition parameter A is added to the sample count k to generate the sum A+k. In step 712, the sum A+k is inverted to generate the reciprocal value (1/A+k). In the illustrative embodiment, the inversion step 712 is performed by entering a lookup table.

A comparison step 714 is performed to select the maximum of the tracking parameter S or the reciprocal value 1/(A+k). At step 716, the selected maximum value is provided as a phase coefficient (alpha) to the PLL filter. Steps 708 through 716 are repeated for every n samples. The process ends at step 718.

Examples

Figure 1:
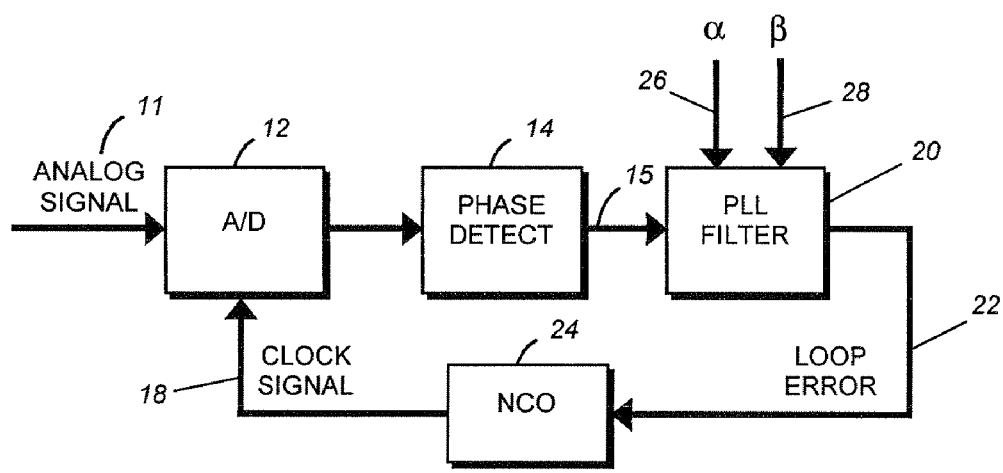
FIG. 1 is a schematic diagram of a typical PLL as known in the prior art.
Figure 2:
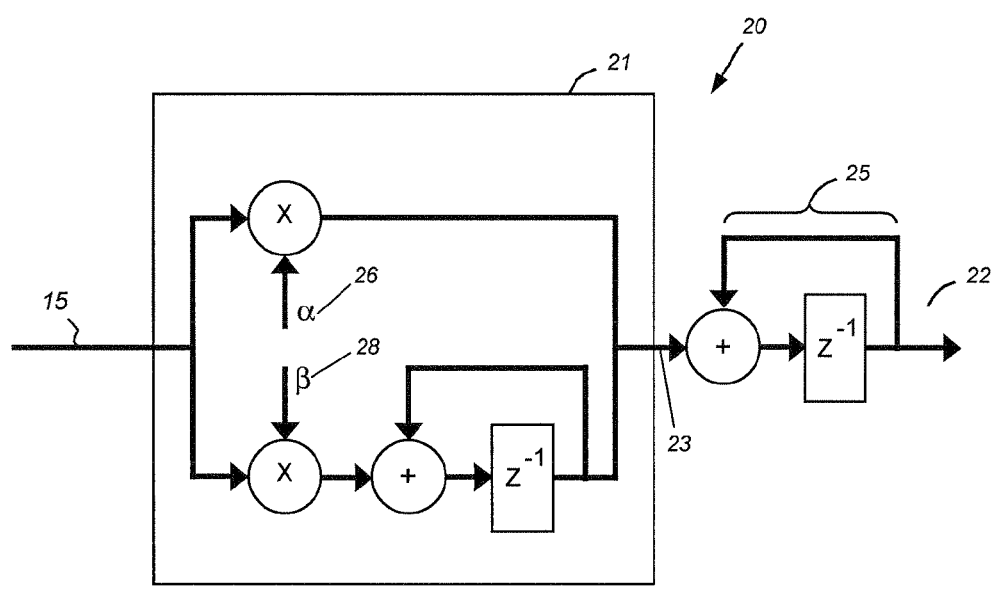
FIG. 2 is a schematic diagram of a second order PLL filter as known in the prior art.
Figure 3:
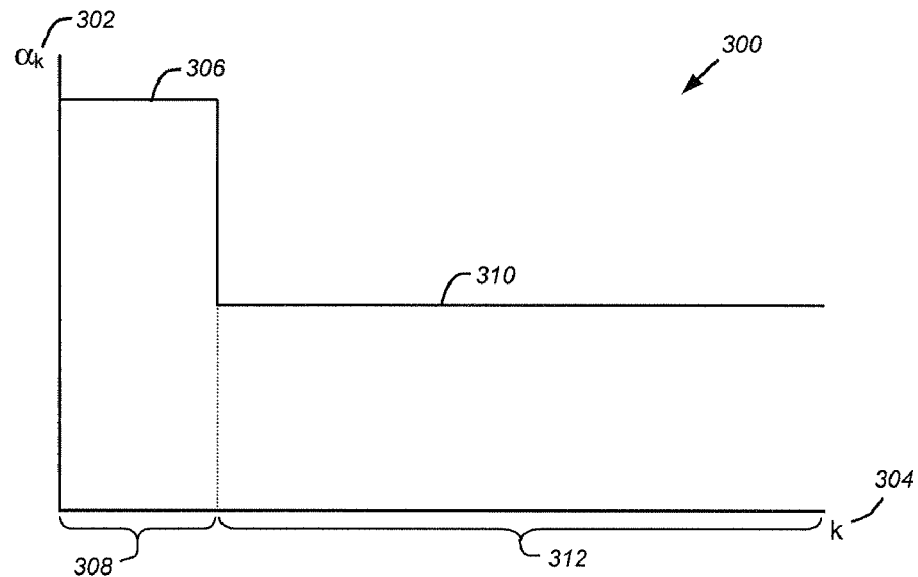
FIG. 3 is a graph of an acquisition mode PLL phase coefficient and a tracking mode PLL phase coefficient as known in the prior art.
Figure 4:
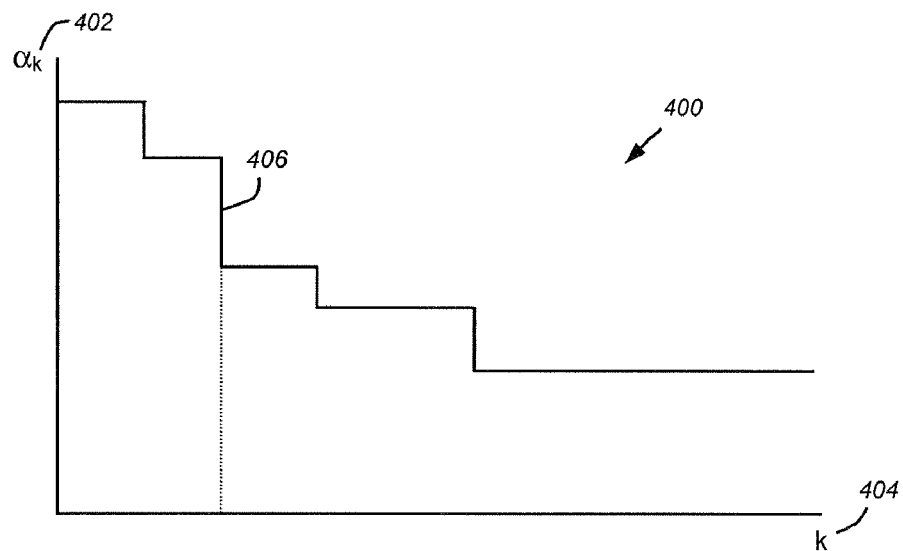
FIG. 4 is a graph of plurality of acquisition mode PLL phase coefficients and tracking mode PLL phase coefficients over different regions as known in the prior art.

A simulation was performed at high error rates using the following three PLL coefficient profiles:
 (1) Known coefficient set comprising optimized coefficients for each of a plurality of regions in the acquisition mode and a plurality of regions in the tracking mode (See FIG. 4);
 (2) Kalman (optimal) profile; and
 (3) Phase coefficients generated using an illustrative embodiment.

In all three cases of the simulation, the frequency coefficients of the PLL were set to zero. Sector failure rates of a disk drive under test simulation were determined to be 0.01, 0.001 and 0.001 respectively for the three cases. Accordingly, the coefficient sets provided by embodiments disclosed herein improved the performance of a PLL by an order of magnitude relative to the known set of optimized coefficients, and matched the performance of a Kalman profile.

The illustrative embodiments disclosed herein can be implemented relatively inexpensively. For example, an embodiment can be constructed using only an adder, a comparator and a single variable inverter (look-up table). The inventive methods are further simplified because the PLL phase coefficients can be generated without recursive algorithms. A coefficient profile provided according to an illustrative embodiment closely approximates the performance of an optimal coefficient generator that is far more complicated to implement.

Although the illustrative embodiments disclosed herein are described generally in terms of a first order PLL having a frequency component set to zero, persons having ordinary skill in the art should appreciate that the additional embodiments can be implemented wherein the PLL can use non-zero frequency components within the scope of the present disclosure. Such embodiments can be useful in systems where frequency error is too large to be ignored, for example.

What is claimed is:

1. A method comprising:
 determining an acquisition parameter (A) based upon at least one synchronization error parameter of a phase locked loop (PLL) circuit, the acquisition parameter being a function of noise variance and variance of initial phase uncertainty;
 counting samples of the analog input signal to determine a sample count;
 adding the acquisition parameter to the sampling count to generate a summation;
 outputting a reciprocal of the summation as an acquisition mode phase coefficient for the phase locked loop circuit.

2. The method of claim 1 further comprising:
 repeating the steps of counting, adding and outputting a reciprocal for every n sample counts, wherein n is a positive integer.

3. The method of claim 1, further compromising:
 determining a tracking mode phase coefficient based upon at least one synchronization error parameter of the phase locked loop circuit;
 comparing the tracking mode phase coefficient with the acquisition mode phase coefficient; and providing the maximum of the tracking mode phase coefficient and the acquisition mode phase coefficient to the PLL as a filter coefficient of the phase locked loop circuit.

4. The method of claim 3 further comprising:
repeating the steps of counting, adding, outputting a reciprocal, comparing and providing a maximum for every n sample counts, wherein n is a positive integer.

5. The method of claim 1 further comprising:
resetting the sample count to zero upon occurrence of a reset condition.

6. The method of claim 5 wherein the reset condition comprises determination of a phase error that exceeds a predetermined limit.

7. The method of claim 5 wherein the reset condition comprises reading a new data block by a disk drive head which provides the analog input signal.

8. The method of claim 1 further comprising:
setting all frequency coefficients of the PLL to zero.

9. The method of claim 1, wherein the acquisition parameter is proportional to a ration of noise variance of initial phase uncertainty.

10. The method of claim 3, wherein the tracking mode phase coefficient is proportional to the standard deviation of disturbance noise over the standard deviation of noise.

11. The method of claim 1 further comprising:
truncating the summation prior to determining the reciprocal so that the step of determining a reciprocal is performed on a truncated summation signal.

12. An apparatus comprising:
a first programmable register for storing an acquisition parameter of a phase locked loop, wherein the acquisition parameter being a function of noise variance and noise of initial phase uncertainty;
a counter in communication with an analog to digital converter of the phase loop, the counter being adapted for providing a sample count of the analog to digital converter;
an adder in communication with the register and the counter, the adder providing a sum of the acquisition parameter and sampling clock count;
an inverter in communication with the adder, the inverter receiving the sum and providing an inverted sum as an acquisition mode phase coefficient to the phase locked loop.

13. The apparatus of claim 12 further comprising:
a second programmable register for storing a tracking parameter;
comparison circuitry in communication with the inverter and the second programmable register, the comparison circuitry adapted to compare the inverted sum with the tracking parameter and provide a maximum of the compared values as a phase coefficient to the phase locked loop.

14. The apparatus according to claim 12, wherein the inverter comprises a lookup table of inverted sums indexed by the sample count.

15. The apparatus according to claim 12 further comprising:
reset circuitry in communication with the counter, the reset circuitry adapted to set the counter to zero upon occurrence of a reset condition.

16. The apparatus according to claim 15 wherein the reset condition comprises determination of a phase error in the phase locked loop that exceeds a predetermined limit.

17. The method of claim 15 wherein the reset condition comprises reading a new data block by a disk drive head, wherein the disk drive head provides the analog input signal being sampled by the analog to digital converter.

18. A computer readable medium comprising:
executable program instructions for generating a phase coefficient of a PLL, the executable program instructions including program instruction for
(i) determining an acquisition parameter (A) based upon at least one synchronization error parameter of the phase locked loop, the acquisition parameter being a function of noise variance and variance of initial phase uncertainty,
(ii) counting samples of an analog input signal to determine a sample count,
(iii) adding the acquisition parameter to the sampling count to generate a summation, and
(iv) determining a reciprocal of the summation.

19. The computer readable medium of claim 18:
wherein the executable program instructions further comprise instructions for
(i) determining a tracking mode phase coefficient based upon at least one synchronization error parameter of the phase locked loop,
(ii) comparing the tracking mode phase coefficient with the reciprocal of the summation, and
(iii) providing the maximum of the tracking mode phase coefficient and the reciprocal of the summation to the PLL as a filter coefficient of the phase locked loop.

20. The method of claim 1 further comprising:
comparing the acquisition mode phase coefficient with a tracking parameter and providing a maximum of the compared values as a phase coefficient to the phase locked loop.

* * * * *